United States Patent
Johnson

(10) Patent No.: US 10,790,077 B2
(45) Date of Patent: Sep. 29, 2020

(54) DEVICES AND METHODS FOR AN ELECTROMAGNETIC COIL

(71) Applicant: Waymo LLC, Mountain View, CA (US)

(72) Inventor: Harry Johnson, Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 163 days.

(21) Appl. No.: 15/799,432

(22) Filed: Oct. 31, 2017

(65) Prior Publication Data

US 2019/0131042 A1 May 2, 2019

(51) Int. Cl.
| | |
|---|---|
| *H01F 5/00* | (2006.01) |
| *H01F 5/04* | (2006.01) |
| *H02K 3/28* | (2006.01) |
| *H01F 30/16* | (2006.01) |

(52) U.S. Cl.
CPC .............. *H01F 5/003* (2013.01); *H01F 5/04* (2013.01); *H02K 3/28* (2013.01); *H01F 30/16* (2013.01)

(58) Field of Classification Search
CPC ............. H01F 5/003; H01F 30/16; H01F 5/04
USPC .................................................. 336/200, 232
See application file for complete search history.

(56) References Cited

U.S. PATENT DOCUMENTS

| | | |
|---|---|---|
| 7,106,078 B1 | 9/2006 | Frank et al. |
| 8,823,241 B2 | 9/2014 | Jore et al. |
| 8,946,952 B2 | 2/2015 | Bi et al. |
| 2002/0175582 A1 | 11/2002 | Lopatinsky et al. |
| 2006/0220491 A1 | 10/2006 | Takeuchi et al. |
| 2007/0228864 A1 | 10/2007 | Graham et al. |
| 2014/0218149 A1* | 8/2014 | Schmidt ............ H01F 5/00 336/73 |
| 2015/0310982 A1* | 10/2015 | Kostelnik ........ H01F 27/303 336/200 |
| 2016/0372259 A1* | 12/2016 | Banba ............. H01F 41/04 |

FOREIGN PATENT DOCUMENTS

| | | | |
|---|---|---|---|
| JP | 05021233 A | * | 1/1993 |
| JP | 05291063 A | * | 11/1993 |
| JP | 06168831 A | * | 6/1994 |
| WO | 2010004491 A1 | | 1/2010 |

OTHER PUBLICATIONS

International Search Report and Written Opinion for PCT/US2018/058499, dated Feb. 26, 2019.

* cited by examiner

*Primary Examiner* — Tszfung J Chan
(74) *Attorney, Agent, or Firm* — McDonnell Boehnen Hulbert & Berghoff LLP

(57) ABSTRACT

Example implementations herein relate to electromagnetic coils. One example device includes a plurality of coil windings. Each coil winding may extend around a shared core region inside the plurality of coil windings between a respective first end and a respective second end. The respective first end is electrically connected to a respective first-end electrical contact. The respective second end is electrically connected to a respective second-end electrical contact. The device also includes a plurality of mountable components. Each mountable component electrically couples a respective first coil winding to a respective second coil winding via the respective first-end electrical contact of the respective first coil winding and the respective second-end electrical contact of the second coil winding.

17 Claims, 9 Drawing Sheets

600

602 Obtain electrical measurements of a plurality of coil windings associated with a shared core region inside the plurality of coil windings 604 Determine electrical characteristics of the plurality of coil windings based on the electrical measurements 606 Mount a plurality of mountable components to electrically couple the plurality of coil windings

DEVICES AND METHODS FOR AN ELECTROMAGNETIC COIL

BACKGROUND

Unless otherwise indicated herein, the materials described in this section are not prior art to the claims in this application and are not admitted to be prior art by inclusion in this section.

Electromagnetic coils can be employed in various devices, such as inductors, electromagnets, transforms, sensors, electric motors, or any other device configured to operate based on interaction between an electrical current and a magnetic field. In some arrangements, an electromagnetic coil can be employed to generate a magnetic field by providing an electrical current to the electromagnetic coil. In other arrangements, an electromagnetic coil can be employed to detect a magnetic field by measuring an electrical current (e.g., induced by the magnetic field) flowing through the electromagnetic coil.

An electromagnetic coil may include one or more electrical conductors (e.g., wires, coil windings, etc.) in a coil, spiral, or helix arrangement, among other possibilities. In some examples, the electromagnetic coil may include multiple coil windings (e.g., coil-shaped wires, etc.) that extend around a core area (e.g., "magnetic axis") at the center of the coil. Further, in some applications, the coil windings can be densely arranged adjacent and/or overlapping one another. To facilitate flow of an electrical current along the length of a particular coil winding before passing into another coil winding, the respective coil windings may be electrically insulated from one another along their respective lengths. For example, a coil winding may have a coating of a nonconductive insulation material, such as plastic or enamel for instance, that extends between the (exposed) terminals or ends of the coil winding.

SUMMARY

In one example, a device includes a plurality of coil windings associated with a shared core region inside the plurality of coil windings. Each coil winding extends around the shared core region between a respective first end and a respective second end. The respective first end is electrically connected to a respective first-end electrical contact. The respective second end is electrically connected to a respective second-end electrical contact. The device also includes a plurality of mountable components. Each mountable component electrically couples a respective first coil winding to a respective second coil winding via the respective first-end electrical contact of the respective first coil winding and the respective second-end electrical contact of the respective second coil winding.

In another example, a method involves obtaining electrical measurements of a plurality of coil windings associated with a shared core region inside the plurality of coil windings. The method also involves determining electrical characteristics of the plurality of coil windings based on the electrical measurements. The method also involves mounting a plurality of mountable components. Each mountable component electrically couples a respective first coil winding to a respective second coil winding via a respective first-end electrical contact of the respective first coil winding and a respective second-end electrical contact of the respective second coil winding.

In yet another example, a device includes a plurality of toroidal coil windings associated with a shared core region inside the plurality of toroidal coil windings. Each toroidal coil winding extends around the shared core region between a respective first end and a respective second end. The respective first end is electrically connected to a respective first-end electrical contact. The respective second end is electrically connected to a respective second-end electrical contact. The device also includes a plurality of mountable components. Each mountable component electrically couples a respective first toroidal coil winding to a respective second toroidal coil winding via the respective first-end electrical contact of the respective first toroidal coil winding and the respective second-end electrical contact of the respective second toroidal coil winding.

In still another example, a system comprises means for obtaining electrical measurements of a plurality of coil windings associated with a shared core region inside the plurality of coil windings. The system also comprises means for determining electrical characteristics of the plurality of coil windings based on the electrical measurements. The system also comprised means for mounting a plurality of mountable components. Each mountable component electrically couples a respective first coil winding to a respective second coil winding via a respective first-end electrical contact of the respective first coil winding and a respective second-end electrical contact of the respective second coil winding.

These as well as other aspects, advantages, and alternatives, will become apparent to those of ordinary skill in the art by reading the following detailed description, with reference where appropriate to the accompanying figures.

DETAILED DESCRIPTION

Figure 1:
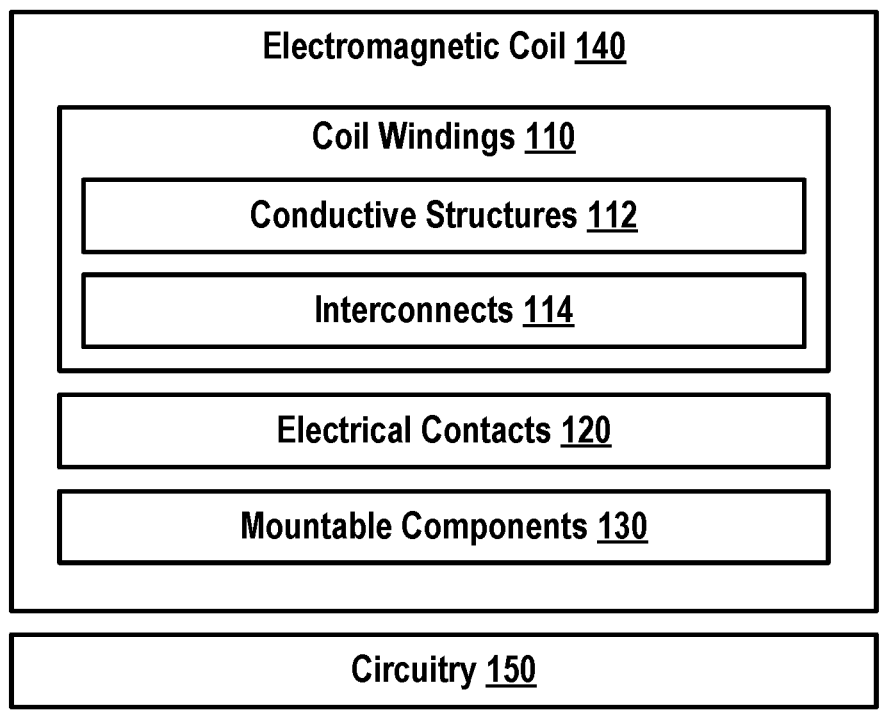
FIG. 1 is a simplified block diagram of a device that includes an electromagnetic coil, according to an example embodiment.

The following detailed description describes various features and functions of the disclosed implementations with reference to the accompanying figures. In the figures, similar symbols identify similar components, unless context dictates otherwise. The illustrative implementations described herein are not meant to be limiting. It may be readily understood by those skilled in the art that certain aspects of the disclosed implementations can be arranged and combined in a wide variety of different configurations.

I. Overview

In some implementations, an electromagnetic coil may include multiple coil windings in a coaxial relative arrangement about a shared core region. For example, the respective turns of the coil windings may be interleaved or otherwise adjacent to one another to form a dense ring of coil windings that define one or more electrically conductive paths around the shared core region. However, in some scenarios, adjacent coil windings may be unintentionally (e.g., due to a defect or a manufacturing error, etc.) electrically coupled (e.g., shorted) at locations other than the terminals (e.g., ends) of the respective coil windings. In these scenarios, the resulting magnetic field generated (or detected) by the coil may differ from an expected magnetic field that would be generated (or detected) without the defect.

To detect such defects, the electrical characteristics of the coil windings can be measured (e.g., flying probe test, etc.) during or after assembly of a coil. For example, a measured resistance of a coil winding can be compared to a predefined value or a range of values expected when the coil winding is properly insulated from adjacent coil windings. However, in some scenarios, testing each coil winding separately may be technically challenging. For example, after assembly of the electromagnetic coil, the terminals or ends of the individual coil windings may be connected to one another in series or parallel to form the electromagnetic coil.

Accordingly, one example device includes a plurality of coil windings associated with a shared core region inside the plurality of coil windings.

In one implementation, the coil windings may comprise a plurality of coil-shaped wires that are wound around the shared core region. In some instances, two or more of the coil-shaped wires may be connected in series to form an electrically conductive path that extends along a length of the core region two or more times. In other instances, two or more of the coil-shaped wires may be connected in parallel to form two separate electrically conductive paths that each extend along a length of the core region.

In another implementation, the coil windings can be formed in a multi-layer circuit board (e.g., printed circuit board (PCB)). For example, the coil windings may comprise a first plurality of conductive structures (e.g., copper traces, etc.) in a first layer of the PCB, and a second plurality of conductive structures in a second layer of the PCB. In one embodiment, the conductive structures in both layers may be circularly arranged around a common axis (e.g., to at least partially overlap one another). Further, a plurality of interconnects (e.g., vias) in the PCB can be arranged to connect the conductive structures in the two layers to form one or more coil-shaped electrically conductive paths around the common axis. With this arrangement for instance, the conductive structures and the interconnects may together define a plurality of toroidal coil windings that are interleaved with one another about a shared core region (e.g., insulation material between the two PCB layers).

The example device may also include a plurality of electrical contacts connected to respective ends of the plurality of coil windings. For example, each coil winding may define a coil-shaped electrically conductive path that extends around the shared core region between two respective electrical contacts. In one embodiment, the electrical contacts (e.g., exposed copper traces) can be disposed along a mounting surface (e.g., top or bottom layer) of a circuit board.

The example device may also include a plurality of mountable components, such as resistors, wires, removable connectors, etc. A given mountable component, when mounted, may electrically couple a first electrical contact of a first coil winding to a second electrical contact of a second coil winding. In one example, the given mountable component may be configured to connect two coil windings in a series circuit configuration. Thus, in this example, two coil-shaped electrically conductive paths (e.g., the two coil windings) can be connected to one another to form a single electrically conductive path that extends along a length of the shared core region twice. In another example, the given mountable component may be configured to connect two coil windings in a parallel circuit configuration. Thus, in this example, two coil-shaped electrically conductive paths (e.g., the two coil windings) connected in parallel can support two electrical currents (e.g., phase-shifted AC signals, etc.) in parallel.

With this arrangement for instance, each coil winding can be individually tested prior to mounting the mountable components that connect the coil windings to one another. For instance, the resistance and/or inductance of a particular coil winding can be measured or probed at the electrical contacts (i.e., terminals) of the particular coil winding prior to connecting the particular coil winding (in series or parallel) with another coil winding. The measured resistance and/or inductance can then be compared with a predetermined value or range of values to determine whether the particular coil winding has a defect.

By way of example, the measured resistance and/or inductance may be outside the predetermined range of values if a loop (e.g., turn) of the particular coil winding is unintentionally connected (e.g., "short circuit") to a loop of another coil winding, or if the particular coil winding does not define an electrically conductive path between the two associated electrical contacts (e.g., "open circuit" between two loops of the particular coil winding), among other possibilities.

In some implementations, after testing the coil windings individually, the plurality of mountable components can then be mounted to the example device to connect the coil windings and form an electromagnetic coil having the shared core region.

II. Example Systems and Devices

Systems and devices in which example embodiments may be implemented will now be described in greater detail. In general, one or more embodiments disclosed herein can be used with any system that includes an electromagnetic coil. A non-exhaustive list of example systems includes electric motors, sensor coils, inductors, transformers, electromagnets, transducers, speakers, rotary joints, or any other system that includes an electromagnetic coil.

FIG. 1 is a simplified block diagram of a device 100 that includes an electromagnetic coil, according to an example embodiment. As shown, device 100 includes an electromagnetic coil 140 and circuitry 150.

Coil 140 may comprise one or more loops of electrically conductive materials (e.g., copper, gold, other metal, etc.) that define one or more electrically conductive paths around a shared core region inside coil 140. In a first example, coil 140 may include an electrical conductor, such as a wire for instance, in the shape of a coil, spiral, or helix extending around a core region inside coil 140. In a second example, coil 140 may include multiple electrical conductors (e.g., wires), each having the shape of a coil, spiral, helix, etc., that are wounded around a shared core region. In this example, each electrical conductor may correspond to a coil winding of coil 140. In a third example, coil 140 may include one or more arrangements of coplanar conductive structures that are connected to one another to form one or more coil windings (i.e., electrically conductive paths, etc.) around the core region of coil 140. Other examples are possible.

In the example shown, coil 140 includes a plurality of coil windings 110, a plurality of electrical contacts 120, and a plurality of mountable components 130.

Coil windings 110 can be implemented in various ways. In some examples, a coil winding can be formed from a wire or other electrical conductor that is wound around a core region to define a magnetic axis of coil 140. In other examples, a coil winding can be formed from multiple conductive structures that are connected to one another to form an electrically conductive path in the shape of a coil, helix, spiral, etc. To that end, the core region of coil 140 can have various shapes such as a cylindrical shape or a toroidal shape, among others.

As shown, coil windings 110 may include a plurality of conductive structures 112 and a plurality of interconnects 114.

Conductive structures 112 may comprise portions of electrically conductive material (e.g., copper, other metal, etc.) that are electrically coupled together to define at least one (e.g., coil-shaped) electrically conductive path around the core region or magnetic axis of coil 140. To that end, interconnects 114 may comprise an arrangement of electrical connections between particular conductive structures to define the electrically conductive paths of coil windings 110.

In one embodiment, conductive structures 112 may include a first plurality of conductive structures in a first coplanar and circular arrangement. In this embodiment, conductive structures 112 may also include a second plurality of conductive structures in a second coplanar arrangement and circular arrangement that overlaps (e.g., parallel to) the first plurality of conductive structures. For instance, in a circuit board implementation, the first plurality of conductive structures can be disposed or patterned along a first layer of the circuit board, and the second plurality of conductive structures can be disposed or patterned along a second layer of the circuit board.

In this embodiment, interconnects 114 may comprise conductive material that extends through a drilled hole between two layers of a circuit board (e.g., vias). With this arrangement, coil windings 110 can be formed about a toroidal core region having an axis of symmetry that extends through a center of the circular arrangements of conductive structures 112. Thus, in this embodiment, interconnects 114 may couple the first plurality of conductive structures (in the first layer of the circuit board) to the second plurality of conductive structures (in the second layer of the circuit board) to define a plurality of toroidal coil windings (i.e., windings 110) extending around the toroidal axis of symmetry.

Other embodiments are possible as well, such as embodiments where coil windings 110 are associated with a core region having a different shape (e.g., cylindrical, etc.).

Electrical contacts 120 may comprise conductive materials (e.g., copper, etc.) that are connected to terminals or ends of respective coil windings of coil windings 110. By way of example, where a particular coil winding includes a set of conductive structures that are connected to one another via interconnects 114, electrical contacts 120 may comprise two particular electrical contacts connected to a first and last conductive structure of the particular coil winding. Thus, in this example, an electrical current flowing through the particular coil winding can be measured and/or provided at the terminals of the particular coil winding defined by the two particular electrical contacts. In one embodiment, the two particular electrical contacts can be disposed on a mounting surface (e.g., top layer or bottom layer) of a circuit board that includes conductive structures 112.

Mountable components 130 may include resistors, wires, plugs, switches, or any other removably mountable electronic component configured to, when mounted to device 100, electrically connect a first electrical contact of a first coil winding to a second electrical contact of a second coil winding. In one example, two of coil windings 110 can be connected in series with one another via a given mountable connector to define an electrically conductive path that extends two times along a length of the core region of coil 140. In another example, two of coil windings 110 can be connected in parallel to one another to define two parallel electrically conductive paths that can support two separate electrical currents along a length of the core region of coil 140. In one embodiment, mountable components 130 may include a low-resistance resistor (e.g., 0.002 ohms, etc.) that is mounted onto a mounting surface of a circuit board to overlap two particular electrical contacts of two coil windings.

Circuitry 150 may include analog or digital components configured to provide and/or detect electrical currents flowing through coil windings 110 of coil 140. To that end, circuitry 150 may include any combination of power sources, controllers, filters, capacitors, transistors, sensors, or any other electronic component.

In one example, circuitry 150 may include sensing elements that measure electrical current(s) induced in coil 140 due to a magnetic field that intersects the core region of coil 140. In this example, circuitry 150 may also include a controller or computer system that determines the magnetic field based on the measured electrical current(s).

In another example, circuitry 150 may include a controller that modulates electrical current(s) flowing through coil 140 to cause coil 140 to generate a magnetic field. In one embodiment, circuitry 150 may provide a 3-phase AC signal through coil 140 to generate a rotating magnetic field using coil 140. Other examples are possible. Further, in some instances, circuitry 150 can modulate the generated magnetic field by adjusting the electrical current(s) flowing through coil windings 110. Accordingly, circuitry 150 may include any combination of wiring, conductive material, capacitors, resistors, amplifiers, filters, comparators, voltage regulators, controllers, and/or any other circuitry arranged to provide and modulate electrical current(s) flowing through coil 140.

As noted above, one or more embodiments disclosed herein can be used with any device that includes an electromagnetic coil. By way of example, a rotary joint device may include a first structure (e.g., rotor) configured to rotate relative to a second structure (e.g., stator). Example systems that employ rotary joint devices include sensor systems (e.g., RADARs, LIDARs, etc.) and robotic systems (e.g., for directing microphones, speakers, robotic components, etc.), among others. To that end, illustrative embodiments described herein include a rotary joint device that includes an electromagnetic coil similarly to device 100.

Figure 2:
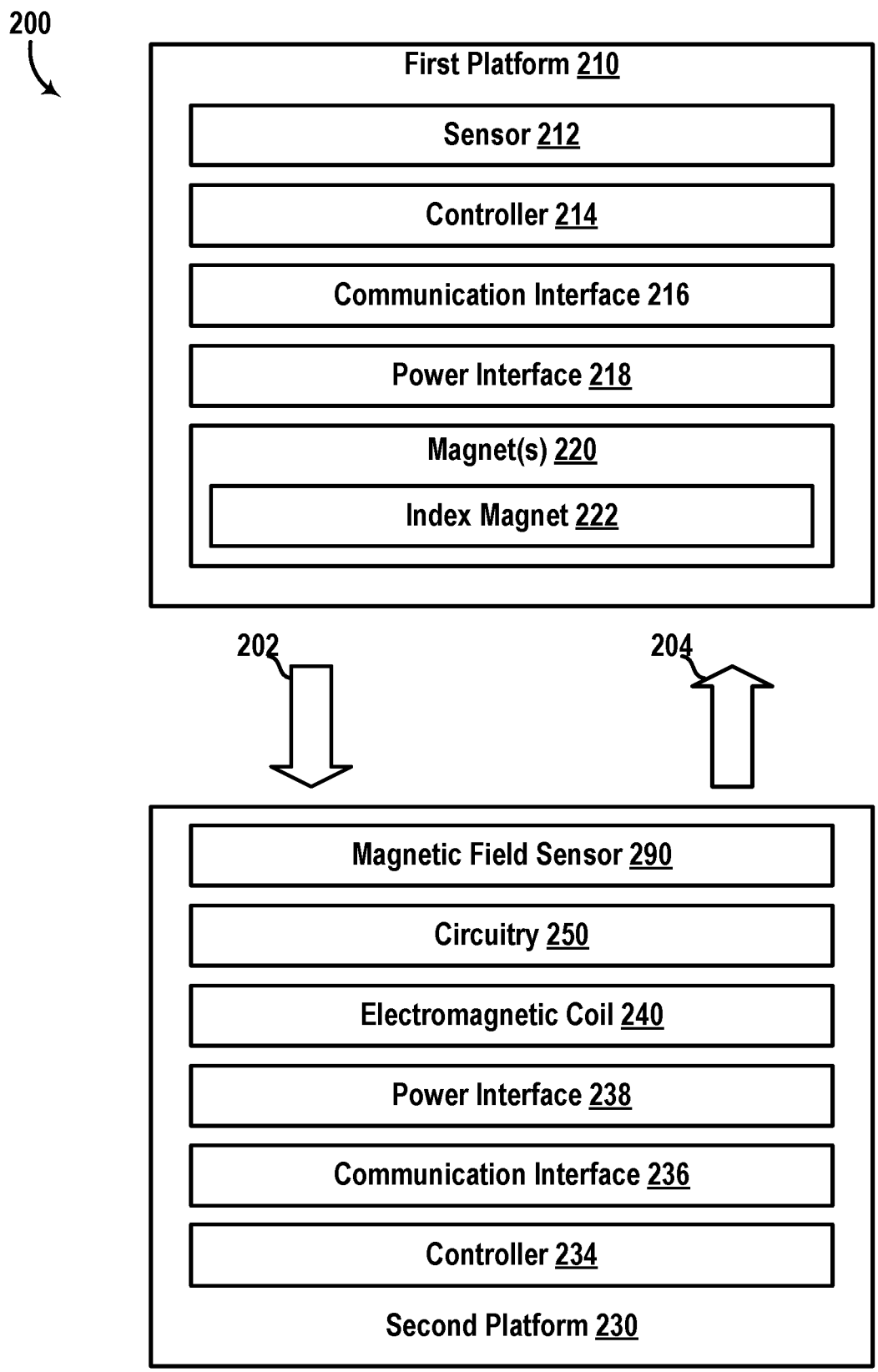
FIG. 2 is a simplified block diagram of a device that includes a rotary joint, according to an example embodiment.

FIG. 2 is a simplified block diagram of a device 200 that includes a rotary joint, according to an example embodiment. As shown, device 200 includes a first platform 210 and a second platform 230.

First platform 210 may comprise or may be coupled to a rotor or other moveable component. For example, platform 210 can be configured to rotate relative to platform 230 and about an axis of rotation of platform 210 (e.g., rotor axis).

Thus, platform 210 can be configured as a rotating platform in a rotary joint configuration. As shown, platform 210 includes a sensor 212, a controller 214, a communication interface 216, a power interface 218, and one or more magnets 220.

In some examples, platform 210 may comprise any solid material suitable for supporting and/or mounting the various components of platform 210. For instance, platform 210 may include a printed circuit board (PCB) that mounts communication interface 216 and/or other components of platform 210. The PCB in this instance can also include circuitry (not shown) to electrically couple one or more of the components of platform 210 (e.g., sensor 212, controller 214, communication interface 216, power interface 218, etc.) to one another. The PCB in this instance can be positioned such that the mounted components are along a side of platform 210 facing or opposite to a corresponding side of platform 230. With this arrangement, for instance, platforms 210 and 230 may remain within a given distance to one another in response to a rotation of platform 210 relative to platform 230.

Sensor 212 may include any combination of sensors mounted to platform 210. A non-exhaustive list of example sensors may include direction sensors (e.g., gyroscopes, accelerometers, etc.), remote sensing devices (e.g., RADARs, LIDARs, etc.), sound sensors (e.g., microphones), among other examples.

Controller 214 may be configured to operate one or more of the components of first platform 210. To that end, controller 214 may include any combination of general-purpose processors, special-purpose-processors, data storage, logic circuitry, and/or any other circuitry configured to operate one or more components of device 200. In one implementation, controller 214 includes one or more processors that execute instructions stored in data storage to operate sensor 212, interface 216, etc. In another implementation, controller 214 alternatively or additionally includes circuitry wired to perform one or more of the functions and processes described herein for operating one or more components of device 200. In one example, controller 214 can be configured to receive sensor data collected by sensor 212, and to provide a modulated electrical signal indicative of the sensor data to communication interface 216. For instance, the sensor data may indicate a measured orientation, a scan of a surrounding environment, detected sounds, and/or any other sensor output of sensor 212.

Communication interface 216 may include any combination of wireless or wired communication components (e.g., transmitters, receivers, antennas, light sources, light detectors, etc.) configured to transmit and/or receive data and/or instructions between platforms 210 and 230. In one example, where communication interface 216 is an optical communication interface, interface 216 may include one or more light sources arranged to emit modulated light signal 202 for receipt by a light detector included in platform 230. For instance, signal 202 may indicate sensor data collected by sensor 212. Further, in this example, interface 216 may include a light detector for receiving modulated light signal 204 emitted from platform 230. For instance, signal 204 may indicate instructions for operating sensor 212 and/or any other component coupled to platform 210. In this instance, controller 214 can operate sensor 212 based on the received instructions detected via interface 216.

Power interface 218 may include one or more components configured for wireless (or wired) transmission of power between platforms 210 and 230. By way of example, interface 218 may include transformer coil(s) (not shown) arranged to receive a magnetic flux extending through the transformer coils to induce an electrical current for powering one or more components (e.g., sensor 212, controller 214, communication interface 216, etc.) of platform 210. For instance, the transformer coils can be arranged around a center region of platform 210 opposite to corresponding transformer coils included in platform 230. Further, for instance, device 200 may also include a magnetic core (not shown) extending through the transformer coils in interface 218 (and/or transformer coils included in platform 230) to guide the magnetic flux through the respective transformer coils thereby improving efficiency of power transmission between the two platforms. Other configurations are possible as well.

Magnet(s) 220 may can be formed from a ferromagnetic material such as iron, ferromagnetic compounds, ferrites, etc., and/or any other material that is magnetized to generate a first-platform magnetic field of platform 210.

In one implementation, magnets 220 can be implemented as a plurality of magnets in a substantially circular arrangement around an axis of rotation of platform 210. For example, magnets 220 can be arranged along a circle that is concentric to the axis of rotation to generate a combined magnetic field extending toward and/or through platform 230. Further, for instance, adjacent magnets of magnets 220 can be magnetized in alternating directions such that a magnetic pole of a given magnet along a surface of the given magnet that is facing platform 230 is opposite to a magnetic pole of an adjacent magnet along a similar surface. With this arrangement for instance, a magnetic field may extend from the surface of the given magnet toward platform 230 and then toward the surface of the adjacent magnet. Further, another magnetic field may extend from a surface of the given magnet toward platform 230 and then toward another adjacent magnet.

In another implementation, magnet 220 can be implemented as a single ring magnet that is concentric to the axis of rotation of the first platform. In this implementation, the ring magnet can be magnetized to have a magnetization pattern similar to that of the plurality of magnets described above. For example, the ring magnet can be implemented as a printed magnet having a plurality of ring sectors (e.g., regions of the ring magnet between respective radial axes thereof). In this example, adjacent ring sectors of the ring magnet can be magnetized in alternating directions to define a plurality of alternating magnetic poles facing platform 230.

As shown, magnet(s) 220 can optionally include an index magnet 222. Index magnet 222 may include a magnet (e.g., ferromagnetic material, etc.) that is configured to have a characteristic that differs from that of the other magnets in magnets 220.

Second platform 230 can be configured as a stator platform in a rotary joint configuration. For instance, the axis of rotation of platform 210 can extend through platform 230 such that platform 210 rotates relative to platform 230 while remaining within a given distance to platform 230. As shown, platform 230 includes a controller 234, a communication interface 236, a power interface 238, an electromagnetic coil 240, circuitry 250, and a magnetic field sensor 290. To that end, platform 230 can be formed from any combination of solid materials suitable for supporting the various components mounted or otherwise coupled to platform 230. In some examples, platform 230 may comprise a circuit board that mounts one or more components (e.g., interfaces 236, 238, sensor 290, etc.) of device 200.

Controller 234 can have various physical implementations (e.g., processors, logic circuitry, analog circuitry, data storage, etc.) similarly to controller 214, for example. Further, controller 234 can operate communication interface 236 to transmit signal 204 indicating a transmission of data or instructions similarly to, respectively, controller 214, communication interface 216, and signal 202, for example. For instance, controller 234 can operate interface 236 (e.g., transceiver, antenna, light sources, etc.) to provide a modulated wireless signal indicating instructions for operating sensor 212 and/or any other component of platform 210. Further, for instance, controller 290 can receive a modulated electrical signal from interface 236 indicating modulated signal 202 transmitted from platform 210.

Communication interface 236 can be implemented similarly to interface 216 to facilitate communication between platforms 210 and 230 via signals 202 and 204.

Power interface 238 can be configured similarly to power interface 218, and may thus be operated in conjunction with power interface 218 to facilitate transmission of power between platforms 210 and 230. By way of example, interface 238 may comprise a transformer coil (not shown), and controller 234 can be configured to cause an electrical current to flow through the transformer coil. The electrical current may then generate a magnetic flux that extends through a corresponding transformer coil (not shown) of power interface 218 to induce an electrical current through the corresponding transformer coil. The induced electrical current could thus provide power for one or more components of platform 210.

Electromagnetic coil 240 and circuitry 250 may be similar, respectively, to electromagnetic coil 140 and circuitry 150, for example.

In one implementation, circuitry 250 (and/or controller 234) can cause one or more electrical currents to flow through coil 240 to generate a second-platform magnetic field inside coil 240. Thus, the first-platform magnetic field of platform 210 may interact with the second-platform magnetic field of platform 230 to provide a force or torque on platform 210. The induced force may then cause platform 210 to rotate about the axis of rotation thereof. Further, in some instances, circuitry 250 (and/or controller 234) can modulate the second-platform magnetic field by adjusting the electrical current(s) flowing through coil 240. By doing so, for instance, device 200 can control a direction or rate of rotation of platform 210.

Magnetic field sensor 290 may be configured to measure one or more characteristics (e.g., direction, angle, magnitude, flux density, etc.) of the first-platform magnetic field associated with magnet(s) 220. For example, sensor 290 may include one or more magnetometers arranged to overlap magnet(s) 220 and/or the first-platform magnetic field. A non-exhaustive list of example sensors includes proton magnetometers, Overhauser effect sensors, cesium vapor sensors, potassium vapor sensors, rotating coil sensors, Hall effect sensors, magneto-resistive device sensors, fluxgate magnetometers, superconducting quantum interference device (SQUID) sensors, micro-electro-mechanical-system (MEMS) sensors, and spin-exchange relaxation-free (SERF) atomic sensors, among other examples. In one implementation, sensor 290 may comprise a three-dimensional (3D) Hall effect sensor that outputs an indication of an angle (and/or magnitude) of the first-platform magnetic field at a position of sensor 290 according to an orthogonal coordinate system representation (e.g., x-y-z axis components) or other vector field representation.

Thus, device 200 could use output(s) from sensor 290 as a basis for determining an orientation or position of platform 210 about the axis of rotation. By way of example, sensor 290 can be positioned to overlap a portion of the first-platform magnetic field extending between two adjacent magnets of magnet(s) 220. As first platform 210 rotates, the angle of the portion may change at the position of sensor 290 and thus circuitry 250 (and/or controller 234) can sample outputs from sensor 290 to deduce the position of sensor 290 relative to the two adjacent magnets.

Thus, with this arrangement, device 200 could use magnet(s) 220 as component(s) for both actuating platform 210 and measuring the orientation of platform 210 (e.g., magnetic encoder). This arrangement can provide an actuator and a magnetic encoder with reduced costs and with a more compact design.

In implementations where magnet(s) 220 include index magnet 222, a particular portion of the first-platform magnetic field extending between index magnet 222 and one or more magnets adjacent to index magnet 222 may have one or more differentiating characteristics relative to other portions of the first-platform magnetic field. By of example, if index magnet 222 is positioned at a different distance to the axis of rotation of platform 210 than a substantially uniform distance between the axis of rotation and other magnets of magnet(s) 220, then a direction of the particular portion of the first-platform magnetic field may differ from respective directions of the other portions. Accordingly, in some examples, circuitry 250 (and/or controller 234) can associate detection of this difference with an orientation of platform 210 where sensor 290 overlaps index magnet 222 or a region between index magnet 222 and an adjacent magnet. Through this process, for instance, device 200 can map outputs of sensor 290 to a range of orientations of platform 210 relative to a position of index magnet 222.

In some implementations, device 200 may include fewer or more components than those shown. In one example, device 200 can be implemented without index magnet 222, sensor 290, and/or any other component shown. In another example, platforms 210 and/or 230 may include additional or alternative sensors (e.g., microphone, etc.), computing subsystems, and/or any other component. Additionally, it is noted that the various functional blocks shown can be arranged or combined in different arrangements than those shown. For example, some of the components included in platform 210 can be alternatively included in platform 230 or implemented as separate components of device 200.

Figure 3A:
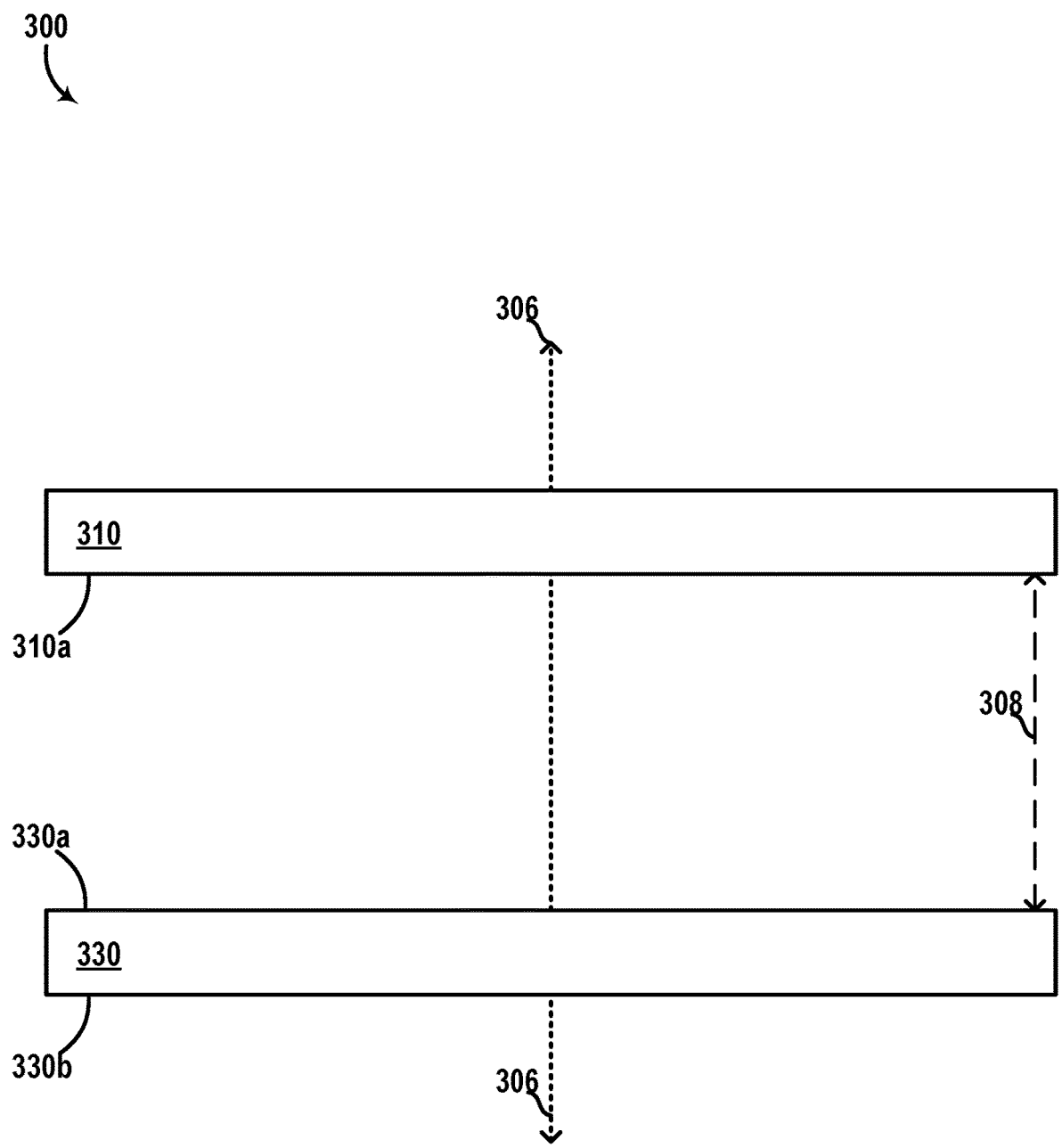
FIG. 3A illustrates a side view of a device that includes a rotary joint, according to an example embodiment.

FIG. 3A illustrates a side view of a device 300 that includes a rotary joint, according to an example embodiment. As shown, device 300 includes a rotor platform 310 and a stator platform 330 that may be similar, respectively, to platforms 210 and 230. In the example shown, a side 310a of platform 310 is positioned at a given distance 308 to a side 330a of platform 330. Platform 310 can be configured as a rotor platform that rotates about axis of rotation 306. Further, platform 330 can be configured as a stator platform that remains within distance 308 to platform 310 in response to rotation of platform 310 about axis 306. In some examples, side 310a may correspond to a planar mounting surface of platform 310 (e.g., an outer layer of a circuit board). Similarly, for example, side 330a may correspond to a planar mounting surface of platform 330.

Figure 3B:
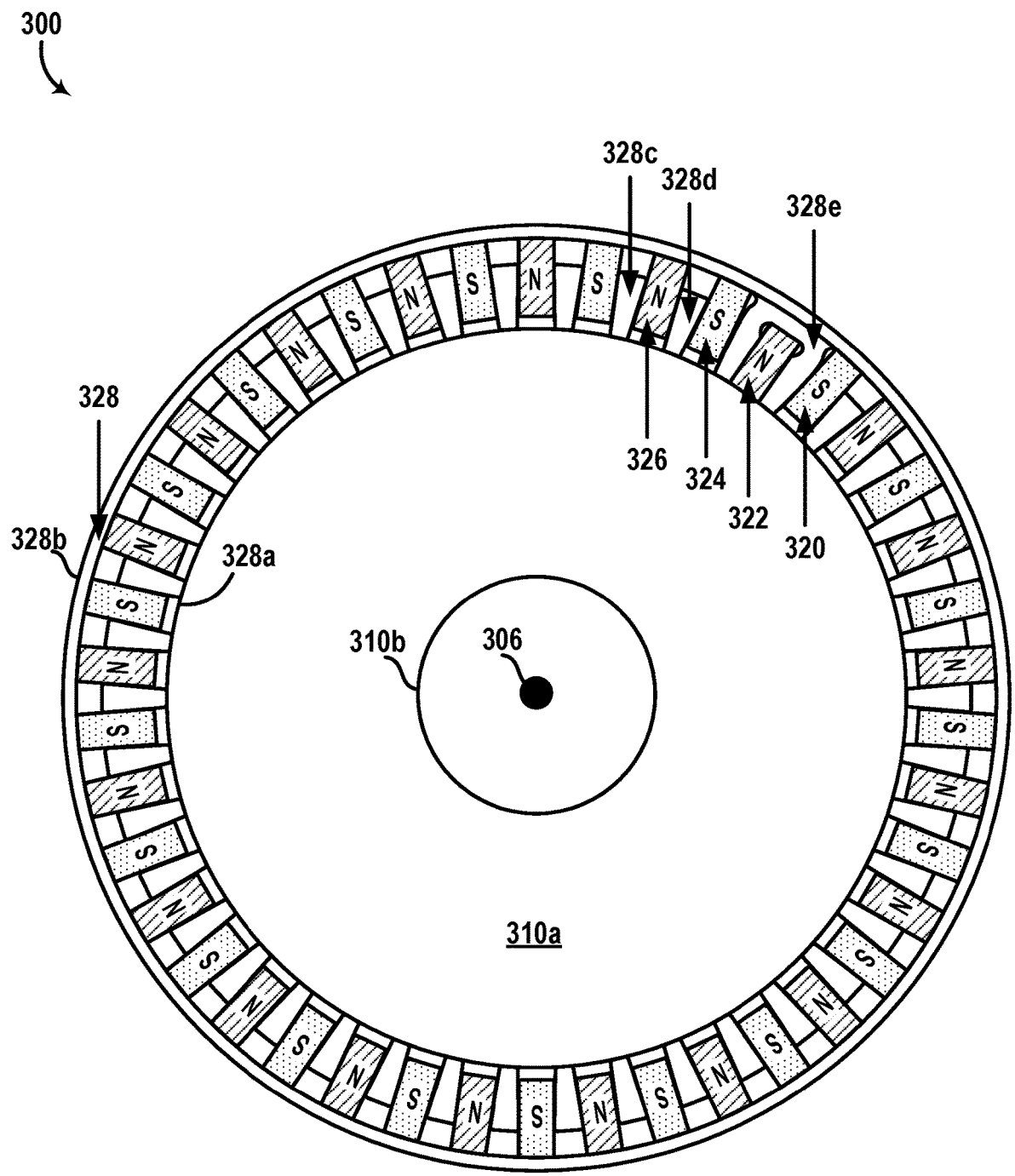
FIG. 3B illustrates a cross-section view of the device in FIG. 3A.

FIG. 3B illustrates a cross-section view of device 300. In FIG. 3B, axis 306 extends through the page. As shown in FIG. 3B, device 300 also includes a mount 328 and a plurality of magnets, exemplified by magnets 320, 322, 324, 326.

Magnets 320, 322, 324, 426, can be similar to magnet(s) 320. For example, as shown, magnets 320, 322, 324, 326, are mounted in a substantially circular arrangement around axis of rotation 306. In some examples, adjacent magnets of device 300 can be magnetized in alternating directions. For example, as shown, magnet 320 is magnetized in a direction pointing into the page (e.g., South Pole indicated by letter "S" pointing out of the page), magnet 322 is magnetized in a direction pointing out of the page (e.g., North Pole indicated by letter "N" pointing out of the page), magnet 324 is magnetized in the same direction as magnet 320, and so on. Thus, in some examples, the respective magnetization directions of the plurality of magnets (e.g., 320, 322, 324, 326, etc.) could be substantially parallel to axis 306, as shown.

Mount 328 may include any structure configured to support the plurality of magnets of platform 310 in a circular arrangement around axis 306. To that end, mount 328 may include any solid structure (e.g., plastic, aluminum, other metal, etc.) suitable for supporting the plurality of magnets in the circular arrangement. For example, as shown, mount 328 can have a ring shape extending between (circular) edges 328a and 328b. Further, as shown, mount 328 may include indentations that accommodate the plurality of magnets in the circular arrangement. For instance, as shown, mount 328 includes an indentation (between walls 328c and 328d) shaped to accommodate magnet 326. Thus, during assembly for instance, the plurality of magnets could be fitted into respective indentations of mount 328 to facilitate placing the plurality of magnets in the circular arrangement. Further, as shown, ring-shaped mount 328 could be concentrically arranged relative to axis 306 (e.g., axis 306 aligned with a center axis of ring-shaped mount 328). Thus, for instance, circular edges 328a, 328b, and magnets 320, 322, 324, 326, etc., could remain within respective given distances to axis 306 in response to rotation of platform 310 about axis 306.

In some examples, similarly to index magnet 222, at least one magnet in device 300 can be configured as an index magnet having one or more characteristics that differ from a common characteristic of other magnets. As shown, for example, magnet 322 is mounted at a different distance to axis 306 than a distance between other magnets (e.g., 320, 324, 326, etc.) and axis 306. To facilitate this, as shown, an indentation (e.g., defined by wall 328e) that accommodates index magnet 322 could have a smaller length than respective indentations accommodating magnets 320, 324, 326, etc. As a result, index magnet 322, when mounted, may be closer to edge 328a (and axis 306) than magnets 320, 324, 326, etc.

As shown in FIG. 3B, platform 310 may include a center gap defined by edge 310b. In this example, platform 310 may include a transformer coil (not shown) arranged around edge 310b. Further, in this example, device 300 may include a magnetic core (not shown) extending through the center gap to guide a magnetic flux generated by a similar transformer coil (not shown) of platform 330. Thus, for instance, power can be transmitted between platforms 310 and 330, in line with the discussion above for power interfaces 218 and 238.

It is noted that platform 310 may include additional or fewer components than shown. In one example, mount 328 can be arranged along a periphery of a printed circuit board (PCB) or other circuit board. In another example, mount 328 can be disposed along a surface or layer of the circuit board.

Figure 3C:
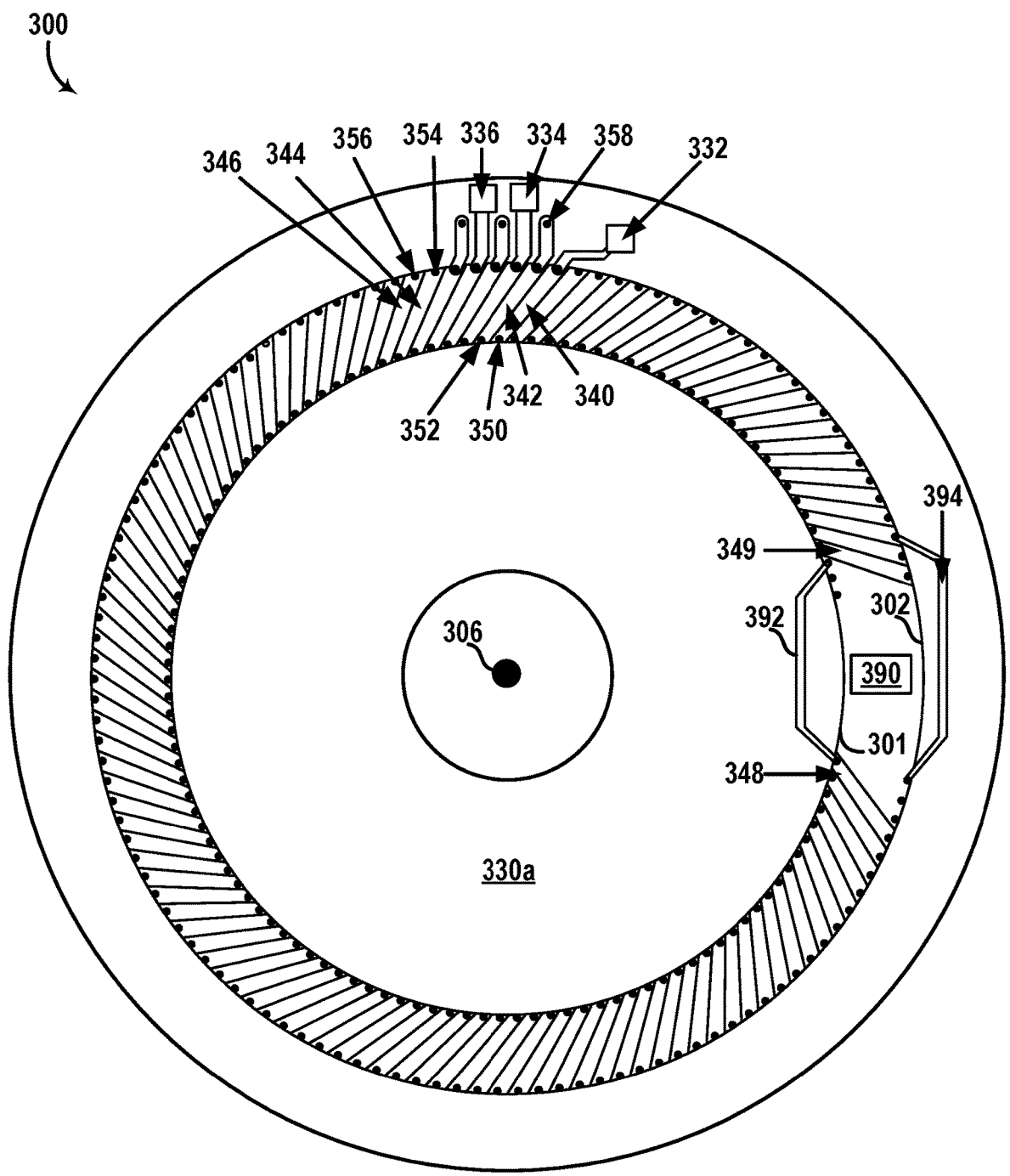
FIG. 3C illustrates another cross-section view of the device in FIG. 3A.
Figure 3D:
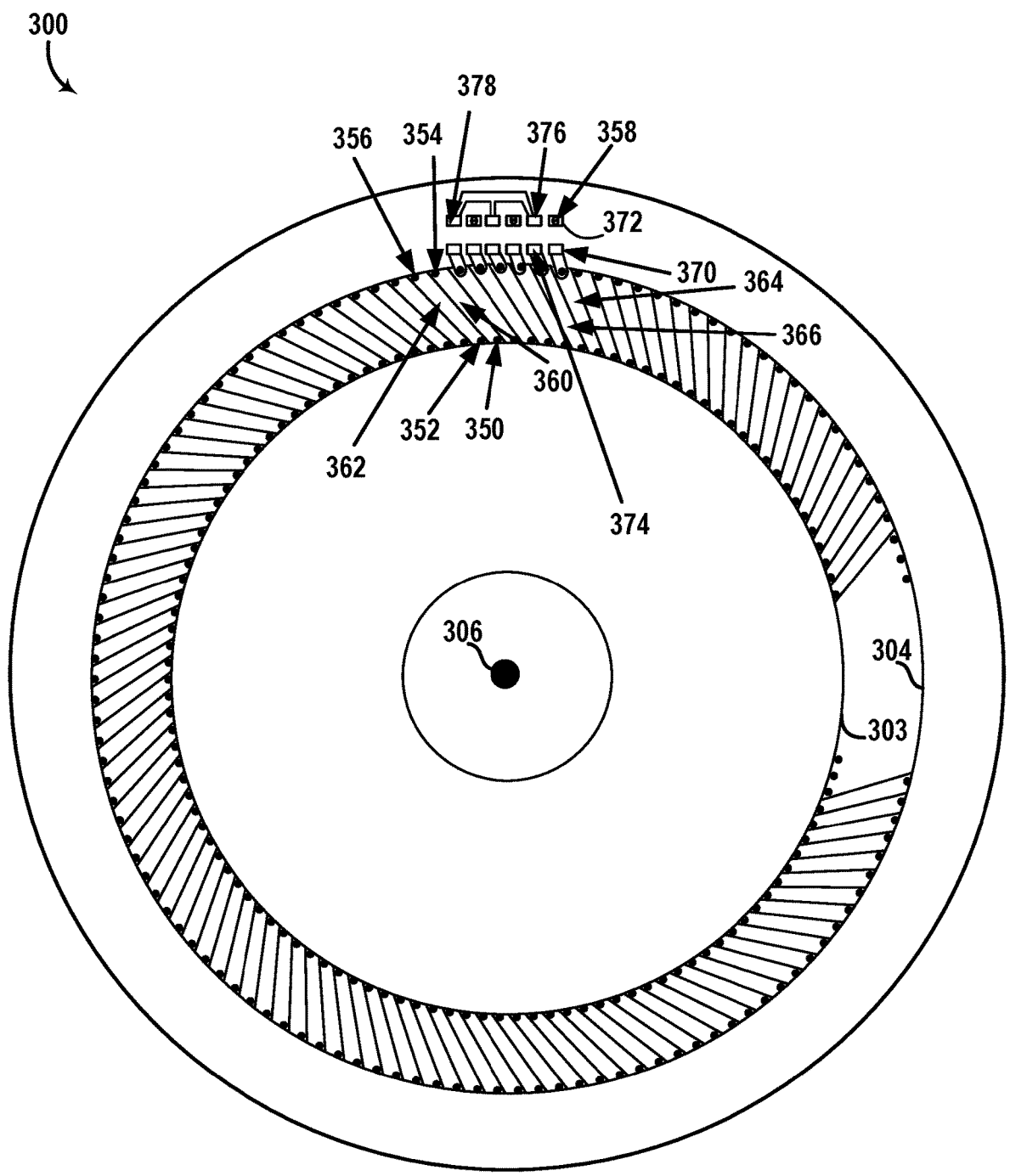
FIG. 3D illustrates yet another cross-section view of the device in FIG. 3A.

FIGS. 3C and 3D illustrate other cross-section views of device 300. In the cross section view of FIG. 3C, side 330a of platform 330 is along the surface of the page. The cross section view of FIG. 3D may correspond to a view of a layer of platform 330 that is substantially parallel to side 330a. For example, the layer shown in FIG. 3D may correspond to a layer between sides 330a and 330b of platform 330 (e.g., inner layer, etc.). Alternatively, for example, the layer shown in FIG. 3D may correspond to a layer at side 330b of platform 330 (e.g., outer layer, etc.). In one implementation, platform 330 can be physically implemented as a multi-layer circuit board (e.g., PCB) or may comprise a multi-layer PCB embedded therein. To that end, one or more components shown in FIG. 3C may correspond to electrically conductive material(s) (e.g., tracks, traces, copper, etc.) patterned along a first layer of the PCB, and one or more components shown in FIG. 3D may correspond to electrically conductive material(s) patterned along a second layer of the PCB. Other implementations are possible as well.

As shown in FIG. 3C, device 300 also includes a first plurality of conductive structures, exemplified by structures 340, 342, 344, 346, 348, 349, a plurality of interconnects, exemplified by interconnects 350, 352, 354, 356, 358, a magnetic field sensor 390, and connectors 392, 394. As shown in FIG. 3D, device 300 also includes a second plurality of conductive structures, exemplified by structures 360, 362, 364, 366. As shown in FIGS. 3C and 3D, device 300 also includes a plurality of electrical contacts, exemplified by contacts 332, 334, 436, 370, 372, 374, 376, 378.

Electrical contacts 332, 334, 336 shown in FIG. 3C may be configured to electrically couple, respectively, the first and second pluralities of conductive structures to a power source, voltage regulator, current amplifier, or other circuitry (e.g., circuitry 350) that provides or conditions one or more electrical currents flowing through the respective conductive tracks coupled to the respective contacts. To that end, contacts 332, 334, 336 can be formed from a conductive material (e.g., copper, etc.) disposed in the layer of platform 330 shown in FIG. 3C. In one example, contacts 332, 334, 336 can be configured to provide a 3-phase AC signal into the coil windings defined by the conductive structures. In this example, 3-phase AC signal can be modulated to control the stator-platform magnetic field generated by platform 330. However, other implementations are possible as well (e.g., 2-phase signal, etc.).

The first plurality of conductive structures (340, 342, 344, 346, 348, 349, etc.) shown in FIG. 3C may comprise electrically conductive material (e.g., copper, etc.) in a circular arrangement around axis 306. For instance, as shown in FIG. 3C, the first plurality of conductive structures extends between circles 301 and 302, which are concentric with axis 306. A region of side 330a between circles 301 and 302, for instance, may at least partially overlap the plurality of magnets 320, 322, 324, 326, etc., of rotor platform 310. Further, as shown in FIG. 3C, each conductive structure (e.g., structure 342, etc.) is tilted in a first direction (e.g., clockwise) about axis 306. In addition, the first plurality of conductive structures is in a substantially coplanar arrangement. Thus, for instance, structures 340, 342, 344, 346, 348, 349, etc., can be formed as patterned conductive tracks along a single layer of a circuit board (e.g., PCB).

Similarly, the second plurality of conductive structures (360, 362, 364, 366, etc.) shown in FIG. 3D are in a circular arrangement that is substantially coplanar (e.g., along a second layer of the PCB). Thus, for example, the first plurality of conductive structures may be at a first distance to rotor platform 310 that is less than a second distance between the second plurality of conductive structures and rotor platform 310.

Additionally, structures 360, 362, 364, 366, etc., extend, respectively, between circles 303 and 304. Circles 303 and 304 may be similar to circles 301 and 302 and may thus be concentric to axis 306 with similar radii, respectively, as the radii of circles 301 and 302. As shown in FIG. 3D, the second plurality of conductive structures is tilted in a second direction relative to axis 306 (e.g., counterclockwise direction). Thus, the second plurality of structures in FIG. 3D are tilted in an opposite direction to the tilting direction of the first plurality of structures of FIG. 3C. For example, structure 340 (FIG. 3C) is tilted in a clockwise direction around axis 306. Whereas, structure 360 (FIG. 3C) is tilted in a counterclockwise direction around axis 306.

As noted above, the first and second pluralities of conductive structures can be electrically coupled to one another to form a plurality of coil windings. To facilitate this, interconnects 350, 352, 354, 356, 358, etc., may comprise conductive material that extends through platform 330 (e.g., through the page) to connect respective conductive structures that overlap at the respective positions of the interconnects. For example, interconnect 350 electrically couples conductive structure 340 (FIG. 3C) to conductive structure 360 (FIG. 3D). Similarly, interconnect 352 electrically couples conductive structure 342 (FIG. 3C) to conductive structure 362 (FIG. 3D), etc.

With this arrangement, for example, a first coil winding of device 300 may define a first conductive path that comprises, in this order: structure 340, interconnect 350, structure 360, interconnect 354, structure 344, etc., through structure 364. Thus, the first coil winding may extend around axis 306 and about a substantially ring-shaped core region inside the first coil winding (i.e., region inside platform 330 between circles 301, 302, 303, 304, and overlapping the first and second pluralities of conductive structures). Thus, in the example shown, the first coil winding may be configured as a toroidal coil winding between the terminals of structures 340 and 364. Similarly, a second coil winding of device 300 may define a second conductive path that comprises, in this order: structure 342, interconnect 352, structure 362, interconnect 356, structure 346, etc., through structure 366.

Thus, in some instances, device 300 may include a plurality of interleaved toroidal coil windings, such as the first and second coil windings described above, that are associated with a shared core region inside the plurality of coil windings. For instance, in FIG. 3C, adjacent structures 340 and 342 may be included in two different toroidal coil windings that encompass a shared core region around axis 306. In one embodiment, where device 300 includes a PCB, the core region may be included in middle layers of the PCB (between the layers shown in FIGS. 3C and 3D).

To that end, for example, when electrical current(s) flow through the plurality of coil windings, a stator-platform magnetic field may be generated inside the shared core region. The stator-platform magnetic field could then interact with the rotor-platform magnetic field associated with the magnets in rotor platform 310 to cause a torque or force that rotates platform 310 about axis 306.

Thus, in some examples, the conductive structures shown in FIGS. 3C and 3D can be electrically coupled (e.g., by the interconnects) to form a coreless PCB motor coil. For instance, the first plurality of conductive structures shown in FIG. 3C can be separated from the second plurality of conductive structures shown in FIG. 3D by an insulating material, such as an electrically insulating layer (e.g., plastic, enamel etc.) between the two layers shown in FIGS. 3C and 3D. In this instance, the stator-platform magnetic field could extend through the insulating material.

However, in other examples, device 300 may include a magnetically permeable core (not shown) between the two layers of FIGS. 3C and 3D to direct or focus the generated stator-platform magnetic field. For instance, a middle layer (not shown) of platform 330 may include a conductive material (e.g., ring shaped copper trace, etc.) disposed between the conductive structures of FIGS. 3C and 3D. To that end, the conductive material in the middle layer may act as a magnetic core that enhances the stator-platform magnetic field therein.

Similarly to contacts 332, 334, 336, etc., shown in FIG. 3C, electrical contacts 370, 372, 374, 376, 378, etc., shown in FIG. 3D may comprise conductive materials (e.g., copper traces, etc.) that are connected to respective ends of the plurality of coil windings of device 300. Continuing with the example above, a first end of the first coil winding (e.g., structure 364) is connected to electrical contact 370. Similarly, an end of the second coil winding (e.g., structure 366) is connected to electrical contacts 372, and another end of the second coil winding (e.g., structure 342) is connected, via interconnect 358, to electrical contact 372.

Thus, with this arrangement, the electrically conductive paths associated with the various coil windings of device 300 can be electrically separated from one another when electrical contacts, 370, 372, 374, 376, 378, etc., are not connected to one another (e.g., "open circuit" configuration). Thus, in line with the discussion above, each coil winding can be individually tested by measuring electrical characteristics (e.g., flying-probe test, etc.) between two respective electrical contacts at the ends or terminals of the respective coil winding.

Further, in some examples, two coil windings can be connected in a series circuit configuration by electrically coupling the electrical contracts. For example, the first coil winding (including structures 340 and 364) can be connected in series with the second coil winding (including structures 342 and 366) by connecting contact 370 to contact 372. For instance, a mountable component (not shown), such as a resistor or a wire, can be mounted onto contacts 370 and 372 to connect the two coil windings. In this instance, an electrical current may flow around axis 306 two times by combining the two conductive paths of the first and second coil windings. The combined conductive path may comprise, for instance, in this order: contact 332, the first coil winding, contact 370, the mountable component (not shown), contact 372, interconnect 358, and then the second coil winding.

Alternatively or additionally, in some examples, two coil windings can be connected in a parallel circuit configuration via the electrical contacts. For example, if a mountable component electrically couples contacts 374 and 376, then the second coil winding may be connected in parallel with a third coil winding around axis 306 (e.g., winding that ends at contact 378).

Magnetic field sensor 390 may be similar to sensor 290. To that end, sensor 390 may include any magnetometer, such as a Hall effect sensor, etc., that is configured to measure the rotor-platform magnetic field generated by the magnets (e.g., 320, 322, 324, 326, etc.) of platform 310. Thus, for instance, a computing system (e.g., controller 234, circuitry 250, etc.) can determine an orientation of platform 310 about axis 306 based on outputs from sensor 390.

To facilitate this, in some examples, sensor 390 can be positioned at a location in platform 330 that substantially overlaps the rotor-platform magnetic field of platform 310. For example, as shown in FIG. 3C, sensor 390 is positioned in the region between circles 301 and 302 (the region that at least partially overlaps the magnets of platform 310). Additionally, to mitigate interference from the stator-platform magnetic field of the coil windings defined by the first and second pluralities of conductive structures, a portion of the coil-shaped conductive paths extending around axis 306 in platform 330 could be interrupted or modified in the region of platform 330 where sensor 390 is located.

As shown in FIG. 3C, for example, the first plurality of conductive structures comprise a plurality of spaced-apart conductive structures that are spaced apart by a substantially uniform distance. However, the first plurality of conductive structures shown in FIG. 3C may include two adjacent structures (e.g., 348 and 349) that are separated by a greater distance than the substantially uniform distance. Similarly, for example, the second plurality of conductive structures (shown in FIG. 3D) may also include two adjacent structures that are separated by a greater distance than the substantially uniform distance between other structures of the second plurality of structures. Thus, as shown in FIG. 3C, sensor 430 can be located between structures 348 and 349 (i.e., within the "gap" in the coil-shaped conductive path(s) extending around axis 306).

To facilitate this, connectors 392, 394, etc., which extend away from the region where sensor 390 is located (e.g., outside the region between circles 301 and 302, etc.), can be employed to electrically couple a portion of the coil-shaped conductive path(s) and a remaining portion of the coil-shaped conductive path(s). To that end, connectors 392 and 394 may comprise conductive material (e.g., copper, metal, metal compound, etc.) that is shaped and/or disposed at an appropriate distance from sensor 390 to reduce the effect of the stator-platform magnetic field on the measurements by sensor 390.

Further, although two connectors 392 and 394 are shown, device 300 may include additional or fewer connectors (e.g., a connector for each coil winding) than shown. Additionally, one or both of connectors 392 and 394 can be alternatively disposed in a different layer than the layer shown in FIG. 3C. Further, although magnetic sensor 390 is shown to be mounted to side 330a of platform 330, in some examples, sensor 390 can be alternatively positioned along a different side (e.g., side 330b) of platform 330 or any other location.

It is noted that the shapes, dimensions, and relative positions shown in FIGS. 3A-3D for device 300 and/or components thereof are not necessarily to scale and are only illustrated as shown for convenience in description. To that end, for example, device 300 and/or one or more components thereof can have other forms, shapes, arrangements, and/or dimensions as well. It is also noted that device 400 may include fewer or more components than those shown, such as any of the components of device 300 (e.g., interfaces, sensors, controllers, etc.), among others.

Figure 4:
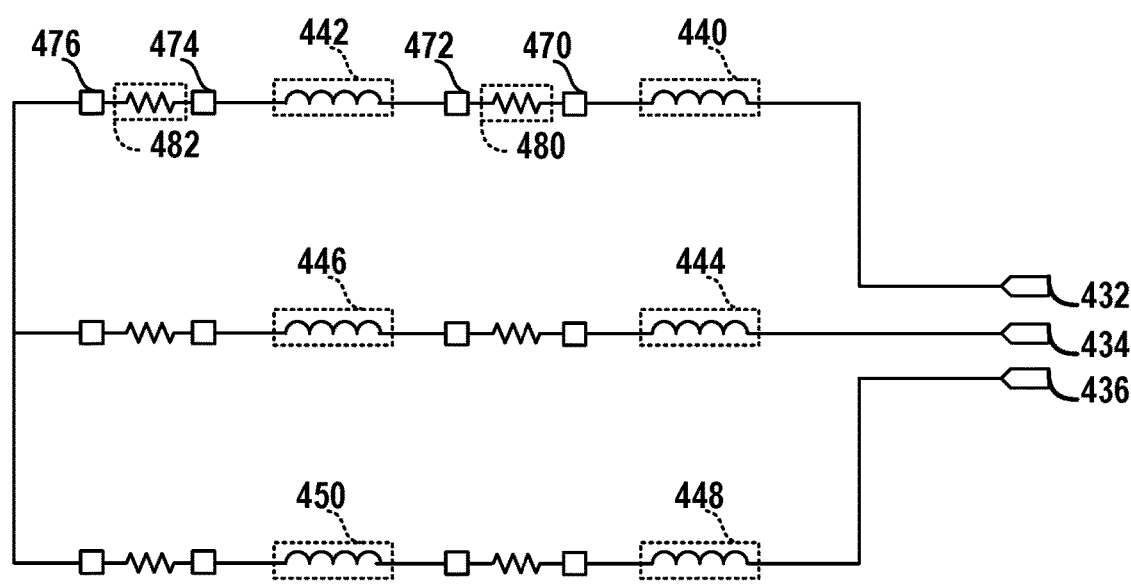
FIG. 4 is a simplified circuit diagram of a device that includes an electromagnetic coil, according to an example embodiment.

FIG. 4 is a simplified circuit diagram of a device 400 that includes an electromagnetic coil, according to example embodiment. Device 400 may be similar to devices 100, 200, and/or 300, for example. As shown, device 400 includes a plurality of electrical contacts 432, 434, 436, 470, 472, 474, 476, a plurality of coil windings 440, 442, 444, 446, 448, 450, and a plurality of mountable components, exemplified by components 480, 482.

In some examples, the illustration in FIG. 4 may correspond to a circuit representation of one or more components of device 300 of FIG. 3.

Contacts 432, 434, 436 may be similar, respectively, to contacts 332, 334, 336. In one implementation, contacts 432, 434, 436 may be connected to a power supply that provides a modulated power signal, such as 3-phase alternating current (AC) signal for instance, that flows through coil windings 440, 442, 444, 446, 448, 450 to generate a rotating magnetic field (e.g., similar to stator-platform magnetic field described for device 300). However, other configurations of the input power signal are possible as well. Thus, in some implementations, device 400 may be configured to provide an electrical signal (via contacts 432, 434, 436) to the coil windings to generate a magnetic field.

In other implementations however, device 400 may be configured to detect electrical current(s) induced in the coil windings by an external magnetic field source (not shown). For example, in a power transformer system, device 400 may be configured to provide electrical power based on a magnetic field generated by another transformer coil (not shown). Thus, in these implementations, contacts 432, 434, 436 can be connected to circuitry (e.g., circuitry 250) that detects and/or otherwise conditions the electrical currents induced in the coil windings.

Coil windings 440, 442, 446, 448, 450 may comprise a plurality of coil windings that overlap a shared core region. To that end, it is noted that coil windings 440, 442, 446, 448, 450 are shown to be in separate physical locations only for convenience in description. In practice, for example, the coil windings may encompass a same core region inside the coil windings.

Referring back to FIGS. 3C-3D for example, coil winding 440 may be implemented as the first toroidal coil winding that includes, in this order: structure 340, interconnect 350, structure 360, interconnect 354, structure 344, etc., through structure 364. Further, coil winding 442 may be implemented as the second toroidal coil winding that includes, in this order: structure 342, interconnect 352, structure 362, interconnect 356, structure 346, etc., through structure 366.

As another example, where device 400 includes an electromagnetic coil having a cylindrical core region. Each coil winding may be implemented as a coil-shaped wire that extends around a circumference of the cylindrical core from one end to an opposite end of the cylindrical core. For instance, the coil windings can be physically stacked to overlap one another around the cylindrical core. Other examples are possible.

Thus, in some examples, conductive loops of coil windings 440, 442, 446, 448, 450 can be intertwined, interleaved, overlapping, or otherwise near one another along the lengths of the respective coil windings.

Electrical contacts 470, 472, 474, 476, may be similar, respectively, to electrical contacts 370, 372, 374, 376. For instance, the electrical contacts can be used to electrically separate terminals (or ends) of the coil windings in device 400. Referring back to FIG. 3D for example, similarly to contacts 370 and 372, contacts 470 and 472 can be interposed between the terminals of coil windings 440 and 442. Further, similarly to contacts 374 and 376, contacts 474 and 476 can be interposed between a terminal of coil winding 442 and the terminals of coil windings 446 and 450.

Mountable components 480, 482, etc., may be similar to mountable components 130 of device 100, for example. In one example, mountable components 480, 482, etc. can be implemented as resistors that are mounted to device 400 to connect respective coil windings in a series and/or parallel configuration. Referring back to FIG. 3D for example, mountable component 480 (e.g., resistor, wire, etc.) can be mounted on the mounting surface that includes contacts 370 and 372 to electrically connect contacts 370, 372 to one another. In this example, mountable component 480 may thus connect two toroidal coil windings (e.g., windings 440 and 442) in a series circuit configuration relative to the power leads (i.e., contacts 432, 434, 436) of the circuit. With this arrangement for instance, the two toroidal coil windings connected in series may define an electrically conductive path that extends around a length of the core region two times. As another example, mountable component 482 can be implemented as a resistor that is mounted on contacts 474 and 476 to connect coil winding 442 to windings 446 and 450 in a parallel circuit configuration relative to the power leads (i.e., contacts 432, 434, 436) of the circuit.

Thus, with this arrangement, mountable components 480, 482, etc., may allow various coil applications (e.g., to control the number of turns or loops in between power terminals, to control the number of turns or loops in parallel conductive paths, etc.). Further, prior to mounting the mountable components, each individual coil winding can be tested for shorts or other defects without interference from the other coil windings. For example, the resistance, inductance, etc., of coil winding 440 can be measured prior to mounting component 480 onto contacts 470 and 472. Similarly, for example, coil winding 442 can be individually tested and/or measured prior to mounting components 480 and 482.

III. Example Methods and Computer-Readable Media

Figure 5:
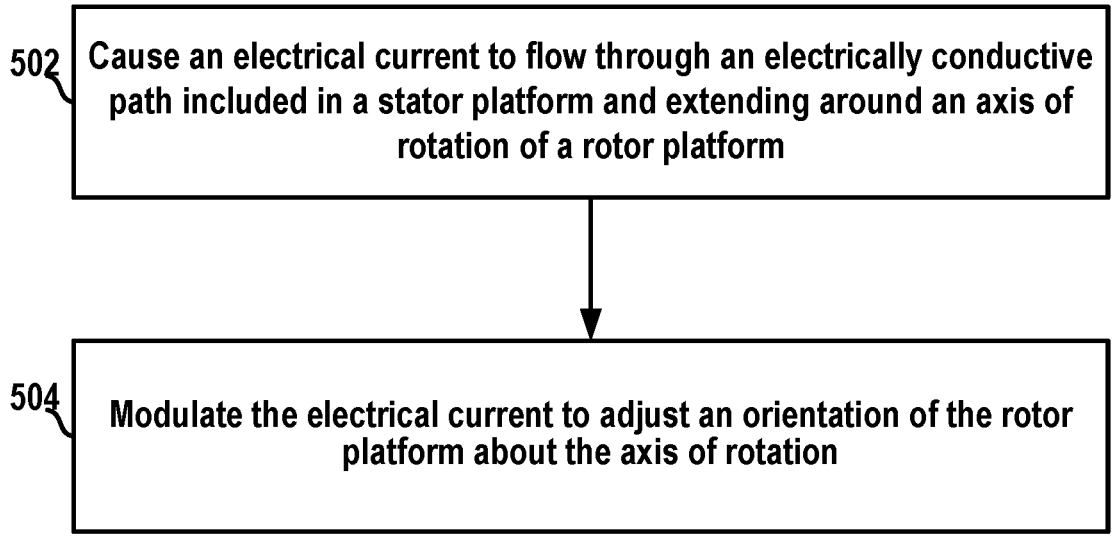
FIG. 5 is a flowchart of a method, according to an example embodiment.

FIG. 5 is a flowchart of a method 500, according to an example embodiment. Method 500 presents an embodiment of a method that could be used with any of devices 100, 200, 300, and/or 400, for example. Method 500 may include one or more operations, functions, or actions as illustrated by one or more of blocks 502-504. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for method 500 and other processes and methods disclosed herein, the flowchart shows functionality and operation of one possible implementation of present embodiments. In this regard, each block may represent a module, a segment, a portion of a manufacturing or operation process, or a portion of program code, which includes one or more instructions executable by a processor for implementing specific logical functions or steps in the process. The program code may be stored on any type of computer readable medium, for example, such as a storage device including a disk or hard drive. The computer readable medium may include a non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

In addition, for method 500 and other processes and methods disclosed herein, each block in FIG. 5 may represent circuitry that is wired to perform the specific logical functions in the process.

Method 500 is an example method for rotating a rotor platform (e.g., first platform 310) of a device (e.g., device 300) relative a stator platform (e.g., second platform 330) of the device and about an axis of rotation of the rotor platform (e.g., axis 306). Thus, in some examples, the rotor platform may remain within a given distance (e.g., distance 308) to the stator platform in response to rotation of the rotor platform, in line with the discussion above.

At block 502, method 500 involves causing an electrical current to flow through an electrically conductive path included in the stator platform and extending around the axis of rotation of the rotor platform. By way of example, device 200 may include circuitry 250 (e.g., power source(s), voltage regulator(s), current amplifier(s), wiring, etc.) that provides the electrical current to the electrically conductive path (e.g., coil windings 440, 442, 444, 446, 448, 450, etc.).

Thus, as noted above, the electrical current flowing through the coil (i.e., arrangement of planar conductive structures) may generate a stator-platform magnetic field that interacts with a rotor-platform magnetic field of the rotor platform such that the rotor-platform rotates about the axis of rotation. For example, the interaction of the magnetic fields may induce a torque or force that causes the rotor platform to rotate about the axis of rotation in a clockwise or counterclockwise direction (depending on the provided current).

At block 504, method 500 involves modulating the electrical current to adjust an orientation of the first platform about the axis of rotation. By way of example, consider a scenario where sensor 212 is a gyroscope (e.g., direction) sensor mounted on platform 210. In the scenario, controller 214 (or 234) may be configured to process outputs from sensor 212 and rotate platform 210 until sensor 212 measure a specific target change in direction (e.g., a value of zero, etc.). In this scenario, circuitry 250 can modulate the electrical current to cause platform 310 to rotate in a particular direction and/or speed opposite to a change in direction or speed measured by sensor 312. Other scenarios are possible as well.

Thus, in some implementations, method 500 also involves modulating a characteristic of the rotation of the rotor platform (e.g., rate, acceleration, direction, etc.). Additionally or alternatively, in some implementations, method 500 also involves obtaining output of a magnetic field sensor (e.g., sensor 290), and determining an orientation of the rotor platform about the axis of rotation based on the output of the magnetic field sensor.

Figure 6:
FIG. 6 is a flowchart of another method, according to an example embodiment.

FIG. 6 is a flowchart of another method 600, according to an example embodiment. Method 600 presents an embodiment of a method that could be used with any of devices 100, 200, 300, and/or 400, for example. Method 600 may include one or more operations, functions, or actions as illustrated by one or more of blocks 602-606. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

At block 602, method 600 involves obtaining electrical measurements of a plurality of coil windings associated with a shared core region inside the plurality of coil windings. At block 604, method 600 involves determining electrical characteristics of the plurality of coil windings based on the electrical measurements.

By way of example, a robotic device can be configured to detect the locations of the electrical contacts (e.g., via computer vision or other sensing apparatus) at the respective ends of the coil windings, and then position probe terminals of a measurement device (e.g., voltmeter, ohmmeter, etc.) onto the electrical contacts. In one implementation, a flying board test system can be used to obtain the electrical measurements. For instance, an example system may be configured to electro-mechanically control probes to access the electrical contacts on a mounting surface of a PCB that includes the coils. Other example systems are possible as well, such as in-circuit test (ICT) systems, manufacturing defects analyzers (MDAs), bed-of-nails test systems, among others.

In some examples, each coil winding may extend around the shared core region between a respective first end (e.g., structure 340) and a respective second end (e.g., structure 364), and may have a respective first-end electrical contact (e.g., contact 332) electrically connected to the respective first end and a respective second-end electrical contact (e.g., contact 370) electrically connected to the respective second end.

Thus, in some examples, obtaining the electrical measurements at block 602 may involve measuring each coil winding via the respective first-end electrical contact of the coil winding and the respective second-end electrical contact of the coil winding. Referring back to FIG. 4 for example, electrical characteristics such as resistance, inductance, etc., can be measured for coil 440 between contact 470 and contact 432. Similarly, the electrical characteristics of coil 442 can be measured between contacts 472 and 474 (e.g., by placing the terminals of a probe on contacts 472, 474), and so on.

At block 606, method 600 involves mounting a plurality of mountable components to electrically couple the plurality of coil windings. In some examples each mountable component may be configured to electrically couple a respective first coil winding to a respective second coil winding via the respective first-end electrical contact of the respective first coil winding and the respective second-end electrical contact of the respective second coil winding. Referring back to FIG. 4 for example, mountable component 480 can be mounted between terminals of coil windings 440 and 442 to connect the windings in a series circuit configuration. As another example, mountable component 482 can be mounted between terminals of windings 442 and 446 (and 450) to connect the windings in a parallel circuit configuration.

In some implementations, mounting the plurality of mountable components at block 606 is based on a comparison between the electrical characteristics determined at block 604 and a threshold range of values. Referring back to FIG. 4 for example, prior to mounting components 480 and 482 to device 400, a computing system (e.g., assembly apparatus, etc.) can compare a measured resistance of coil winding 442 with a predetermined range of values that are expected if winding 442 is not shorted (unintentionally) with another coil winding. If the measured resistance is within the range of values, then the computing system can operate a robotic arm or other apparatus to mount component 480 between contacts 470, 472, and/or to mount component 482 between contacts 474, 476.

IV. Conclusion

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A device comprising:
a plurality of coil windings associated with a shared core region inside the plurality of coil windings, wherein each coil winding extends around the shared core region between a respective first end and a respective second end, wherein the respective first end is electrically connected to a respective first-end electrical contact and the respective second end is electrically connected to a respective second-end electrical contact such that each coil winding defines a coil-shaped electrically conductive path that extends around the shared core region between two electrical contacts; and
a plurality of mountable components, wherein each mountable component electrically couples a respective first coil winding to a respective second coil winding via the respective first-end electrical contact of the respective first coil winding and the respective second-end electrical contact of the respective second coil winding.

2. The device of claim 1, wherein the plurality of mountable components comprise a plurality of resistors.

3. The device of claim 1, wherein the plurality of coil windings are in a toroidal arrangement about the shared core region.

4. The device of claim 1, further comprising:
circuitry that causes one or more electrical currents to flow through the plurality of coil windings, wherein the one or more electrical currents cause the plurality of coil windings to generate a magnetic field associated with the shared core region.

5. The device of claim 1, wherein two or more of the plurality of coil windings are connected in a series circuit configuration via one or more of the plurality of mountable components.

6. The device of claim 1, wherein two or more of the plurality of coil windings are connected in a parallel circuit configuration via one or more of the plurality of mountable components.

7. The device of claim 1, wherein the plurality of coil windings comprise:
a first plurality of conductive structures in a first coplanar arrangement;
a second plurality of conductive structures in a second coplanar arrangement; and
a plurality of interconnects that electrically couple the first plurality of conductive structures with the second plurality of conductive structures to form the plurality of coil windings.

8. The device of claim 7, wherein the first plurality of conductive structures comprise:
a first conductive structure included in a first coil winding; and a second conductive structure adjacent to the first conductive structure in the first coplanar arrangement, wherein the second conductive structure is included in a second coil winding.

9. The device of claim 7, wherein the device further comprises a circuit board, wherein the first plurality of conductive structures are disposed in a first layer of the circuit board, wherein the second plurality of conductive structures are disposed in a second layer of the circuit board, and wherein the plurality of interconnects comprise electrical connections between the first layer and the second layer.

10. The device of claim 7, wherein the first coplanar arrangement is substantially parallel to the second coplanar arrangement.

11. The device of claim 7, further comprising:
a platform that rotates about an axis, wherein the first plurality of conductive structures is at a given distance to the axis.

12. The device of claim 11, wherein the second plurality of conductive structures is at the given distance to the axis.

13. The device of claim 11, wherein the axis extends through a center of the first coplanar arrangement and a center of the second coplanar arrangement, and wherein the axis is perpendicular to the first coplanar arrangement and the second coplanar arrangement.

14. A device comprising:
a plurality of toroidal coil windings associated with a shared core region inside the plurality of toroidal coil windings, wherein each toroidal coil winding extends around the shared core region between a respective first end and a respective second end, wherein the respective first end is electrically connected to a respective first-end electrical contact and the respective second end is electrically connected to a respective second-end electrical contact such that each coil winding defines a coil-shaped electrically conductive path that extends around the shared core region between two electrical contacts; and
a plurality of mountable components, wherein each mountable component electrically couples a respective first toroidal coil winding to a respective second toroidal coil winding via the respective first-end electrical contact of the respective first toroidal coil winding and the respective second-end electrical contact of the respective second toroidal coil winding.

15. The device of claim 14, wherein the plurality of toroidal coil windings comprise:
a first plurality of conductive structures in a first coplanar arrangement;
a second plurality of conductive structures in a second coplanar arrangement; and
a plurality of interconnects that electrically couple the first plurality of conductive structures with the second plurality of conductive structures to form the plurality of toroidal coil windings.

16. The device of claim 15, further comprising:
a circuit board, wherein the first plurality of conductive structures are disposed in a first layer of the circuit board, wherein the second plurality of conductive structures are disposed in a second layer of the circuit board, and wherein the plurality of interconnects extend from the first layer to the second layer.

17. The device of claim 15, wherein the first plurality of conductive structures and the second plurality of conductive structures are concentrically arranged about an axis of symmetry of the plurality of toroidal coil windings.

* * * * *